(12) United States Patent
Torkkeli et al.

(10) Patent No.: US 10,377,625 B2
(45) Date of Patent: Aug. 13, 2019

(54) SCANNING MIRROR DEVICE AND A METHOD FOR MANUFACTURING IT (71) Applicant: MURATA MANUFACTURING CO., LTD., Nagaokakyo-shi, Kyoto (JP)

(72) Inventors: Altti Torkkeli, Tuusula (FI); Tapani Laaksonen, Espoo (FI)

(73) Assignee: MURATA MANUFACTURING CO., LTD., Nagaokakyo-shi (JP)

( * ) Notice: Subject to any disclaimer, the term of this patent is extended or adjusted under 35 U.S.C. 154(b) by 141 days.

(21) Appl. No.: 15/484,740

(22) Filed: Apr. 11, 2017

(65) Prior Publication Data

US 2017/0297898 A1 Oct. 19, 2017

(30) Foreign Application Priority Data

Apr. 18, 2016 (FI) .................................... 20165337

(51) Int. Cl.
*B81B 3/00* (2006.01)
*G02B 7/182* (2006.01)
(Continued)

(52) U.S. Cl.
CPC ............ *B81B 3/0054* (2013.01); *B81B 3/007* (2013.01); *B81B 7/0067* (2013.01);
(Continued)

(58) Field of Classification Search
CPC ...... G02B 1/11; G02B 5/0825; G02B 7/1821; G02B 26/0833; G02B 26/0841;
(Continued)

(56) References Cited

U.S. PATENT DOCUMENTS 8,201,452 B2 * 6/2012 Oldsen ................. B81B 3/0051
73/514.26
8,526,098 B2 * 9/2013 Hofmann .............. B81B 3/0054
359/291
(Continued)

FOREIGN PATENT DOCUMENTS

CN 104909327 A 9/2015
EP 2 381 289 A1 10/2011
(Continued)

OTHER PUBLICATIONS

Finnish Search Report dated Nov. 18, 2016 corresponding to Finnish Patent Application No. 20165337.
(Continued)

*Primary Examiner* — Frank G Font
(74) *Attorney, Agent, or Firm* — Squire Patton Boggs (US) LLP (57) ABSTRACT

An optical device formed of a mirror wafer, a cap wafer, and a glass wafer. The mirror wafer includes a first layer of electrically conductive material, a second layer of electrically conductive material, and a third layer of electrically insulating material between the first layer and the second layer. A mirror element is formed of the second layer of the mirror wafer, and has a reflective surface in the bottom of a cavity opened into at least the first layer. A good optical quality planar glass wafer can be used to enclose the mirror element when the mirror wafer, cap wafer, and glass wafer are bonded to each other.

15 Claims, 8 Drawing Sheets

(51) Int. Cl.
*G02B 26/10* (2006.01)
*B81C 1/00* (2006.01)
*G02B 1/11* (2015.01)
*G02B 5/08* (2006.01)
*G02B 26/08* (2006.01)
*B81B 7/00* (2006.01)

(52) U.S. Cl.
CPC .............. *B81C 1/0019* (2013.01); *G02B 1/11* (2013.01); *G02B 5/0825* (2013.01); *G02B 7/1821* (2013.01); *G02B 26/0833* (2013.01); *G02B 26/0841* (2013.01); *G02B 26/0858* (2013.01); *G02B 26/105* (2013.01); *B81B 2201/042* (2013.01); *B81B 2203/0109* (2013.01); *B81B 2203/0163* (2013.01); *B81B 2207/07* (2013.01); *B81B 2207/095* (2013.01); *B81C 2203/0109* (2013.01); *G02B 26/0816* (2013.01)

(58) Field of Classification Search
CPC .............. G02B 26/0858; G02B 26/105; G02B 26/0816; B81B 3/0054; B81B 2201/042; B81B 2203/0163; B81B 2207/07; B81B 2207/095; B81C 1/0019; B81C 2203/0109
USPC .......................................... 359/199.4; 29/428
See application file for complete search history.

(56) References Cited

U.S. PATENT DOCUMENTS

| | | | | |
|---|---|---|---|---|
| 8,569,090 | B2* | 10/2013 | Taheri | B81B 7/007 438/456 |
| 9,567,213 | B1* | 2/2017 | Ehmke | B81C 1/00293 |
| 2004/0263937 | A1 | 12/2004 | Fujii et al. | |
| 2005/0129353 | A1 | 6/2005 | Torashima et al. | |
| 2005/0213230 | A1 | 9/2005 | Mochizuki | |
| 2007/0268543 | A1 | 11/2007 | Cho et al. | |
| 2010/0061073 | A1* | 3/2010 | Oldsen | B81B 3/0051 361/807 |
| 2010/0296151 | A1* | 11/2010 | Hofmann | B81B 3/0054 359/291 |
| 2012/0142144 | A1* | 6/2012 | Taheri | B81B 7/007 438/107 |
| 2012/0193607 | A1* | 8/2012 | Wagner | G02B 3/0037 257/13 |
| 2012/0320379 | A1 | 12/2012 | Hofmann et al. | |
| 2014/0139898 | A1 | 5/2014 | Yamada | |
| 2015/0049374 | A1 | 2/2015 | Hofmann et al. | |
| 2016/0159641 | A1* | 6/2016 | Najafi | B81B 7/0064 257/467 |

FOREIGN PATENT DOCUMENTS

| | | |
|---|---|---|
| JP | 638604 A | 1/1988 |
| JP | 6435502 A | 2/1989 |
| JP | 2004-109651 A | 4/2004 |
| JP | 2004109651 A | 4/2004 |
| JP | 2004341320 A | 12/2004 |
| JP | 2005-043612 A | 2/2005 |
| JP | 2005173436 A | 6/2005 |
| JP | 2005257944 A | 9/2005 |
| JP | 2007121467 A | 5/2007 |
| JP | 2010-008613 A | 1/2010 |
| JP | 2010210782 A | 9/2010 |
| JP | 2011-112803 A | 6/2011 |
| JP | 2011-112807 A | 6/2011 |
| JP | 2011176426 A | 9/2011 |
| JP | 2012-051062 A | 3/2012 |
| JP | 2012513621 A | 6/2012 |
| WO | 2010074649 A1 | 7/2010 |

OTHER PUBLICATIONS

Ulrich Hofmann et al, "Resonant biaxial 7-mm MEMS mirror for omnidirectional scanning," Journal of Micro/Nanolithography, MEMS, and MOEMS, Jan.-Mar. 2014/vol. 13(1).

Dorian Gangloff et al., "Preventing and Reversing Vacuum-Induced Optical Losses in High-Finesse Tantalum (V) Oxide Mirror Coatings", Optical Society of America, Optics Express 23, No. 14, 2015, 15 pages.

European Search Report Application No. EP17165853 dated Aug. 17, 2017.

Feb. 28, 2018 Office Action issued in Japanese Patent Application No. 2017-082392.

Sven T.S. Holmstrom et al., "MEMS Laser Scanners: A Review", Journal of Microelectromechanical Systems, vol. 23, No. 2, Apr. 2014, pp. 259-275.

Ulrich Hofmann et al., "Resonant Biaxial 7-mm MEMS Mirror for Omnidirectional Scanning", Journal of Micro/Nanolithography, MEMS, and MOEMS, Jan.-Mar. 2014/ vol. 13(1), pp. 011103-1 to 011103-12.

* cited by examiner

SCANNING MIRROR DEVICE AND A METHOD FOR MANUFACTURING IT

BACKGROUND

Field

The present invention relates to optical devices, and specifically to scanning mirror structures manufactured with MEMS technologies.

Description of the Related Art

Recently, mirrors for reflecting a beam of light have been developed based on microelectromechanical system (MEMS) technologies. In a scanning mirror, the direction of reflection can be changed as a function of time. A scanning mirror can direct a light beam over a range of directions in one or two dimensions, and it may also be used to collect light from a range of directions with good angular accuracy and resolution. Scanning operation over an angular range is obtained by tilting the mirror to an angle and varying this angle as a function of time. Often this varied tilting is done in a periodical or oscillating manner. There are several applications for such scanning mirrors, e.g. code scanners, scanning displays and laser ranging and imaging sensors (Lidars).

Typically a MEMS mirror includes a silicon plate with a reflective coating on its top surface, silicon beams for suspension, and actuating structures for one- or two-axis tilting motion of the reflecting silicon plate. Both piezoelectric and electrostatic actuation has been used in the known applications. In either of these methods, achieved forces tend to be too small to generate appropriate deflection amplitudes by direct application of the actuation voltage. Consequently, desired high tilting angles require operation in a resonance mode. The resonance mode operation requires low ambient pressure to minimize gas damping, which means that the mirror needs to be hermetically packaged in a low pressure. Hermetic capping is also important because it eliminates corrosion of reflective surfaces of the mirror.

Wafer-level packaging is presently preferred for MEMS devices in terms of cost, size and manufacturability. It is widely used in mass production of resonating MEMS devices, like gyroscopes and timing resonators. However, MEMS mirrors pose some special requirements for the wafer-level packaging: the element protecting the mirror must provide good optical properties and the package needs to provide enough room for vertical play of the tilting motion of the mirror.

Figure 1:
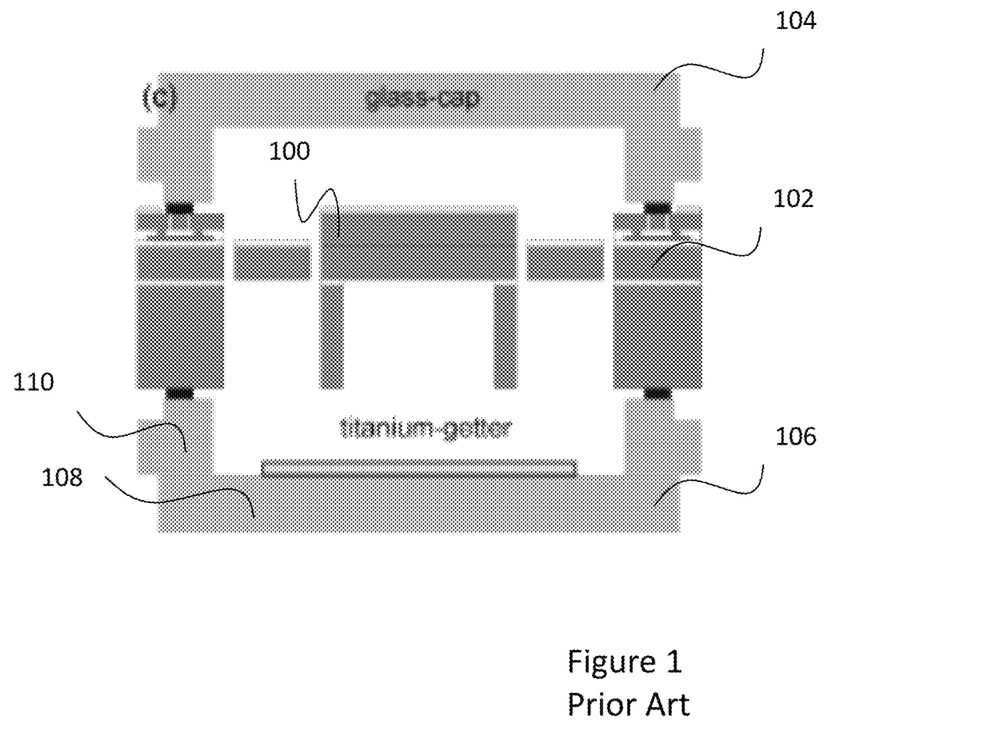
FIG. 1 illustrates a conventional wafer-level packaged MEMS mirror element.

FIG. 1 shows a conventional wafer-level packaged MEMS mirror element, described in document "Resonant biaxial 7-mm MEMS mirror for omnidirectional scanning, Journal of Micro/Nanolitograhy, MEMS and MOEMS, January-March 2014/Vol. 13(1). As shown in FIG. 1, a movable mirror element 100 and elements for actuating it may be formed of a SOI wafer 102 by etching the front side and backside of the SOI wafer. The SOI wafer may then be glass frit bonded to side walls of glass cap wafers 104, 106. Glass cap wafers 104, 106 shown in FIG. 1 are straightforward solutions for hermetic closing of a MEMS mirror package. However, the planar or flat part 108 of the glass cap needs also the spacer part 110 to provide room for the required vertical play of the mirror element. In practice, the required spacing distance may be up to several hundreds of micrometers.

The spacer part 110 is conventionally formed of a spacer wafer bonded to a flat glass wafer that provides the optical window. However, this increases cost and complexity of the wafer encapsulation since more than one bonding interface needs to be formed and potentially more than one bonding technique must be used. For example, a flat glass wafer could be anodically bonded with a silicon spacer wafer, but the silicon spacer wafer would need some other technique for bonding with the silicon wafer of the SOI wafer.

Alternatively, the spacer part 110 may be formed by etching a cavity into a flat glass cap wafer. However, for many of the potential applications the optical quality of such glass cap would not be sufficient. It is well known that it is very difficult to produce a surface that is appropriately smooth for optical applications by etching to the bottom of a cavity. Typically etched glass surfaces are rough and non-planar, which causes optical losses by scattering and unwanted refraction of light.

The solution shown in FIG. 1 is avoids optical losses by shaping the desired profile and cavities by softening the glass cap wafer in high temperature. This may be a feasible solution from the wafer bonding point of view, but manufacture of such shaped glass is a relatively complex and expensive process. It includes bonding of glass first into a sacrificial silicon wafer and etching off the sacrificial silicon wafer after the thermal shaping. The total number of wafers needed for the process is therefore the same as with an additional spacer wafer, which means that also no saving in material cost is achieved. There is also a risk that the high temperatures used for glass softening cause crystallization in the glass, and thereby degradation of the optical properties.

SUMMARY

The object of the present invention is to provide a device that is easy to manufacture and still provides excellent optical capping for a scanning mirror. This and other objects of the present invention are achieved with an optical device and a method for manufacturing an optical device according to the independent claims.

Embodiments of the invention include an optical device that includes a movable mirror part. The optical device comprises a glass wafer with a first planar surface in at least one side of the glass wafer; a mirror wafer that comprises a package of a first layer of electrically conductive material, a second layer of electrically conductive material, and a third layer of electrically insulating material between the first layer and the second layer, wherein the first layer has a first side that faces away from the third layer, and the second layer has a second side against the third layer; a suspension spring structure for suspending the movable mirror part, wherein the movable mirror part and the suspension spring structure are fabricated of the second layer of the mirror wafer; a second cavity that extends through at least the first layer of the mirror wafer, wherein the second cavity is circumscribed in the first side by a second planar surface; a reflecting layer carried by the mirror part in the bottom of the second cavity; a cap wafer that has a third side and a fourth side, and includes a first cavity that extends from the fourth side of the cap wafer into the cap wafer. The cap wafer is bonded to the mirror wafer such that the third side faces away from mirror wafer, and the fourth side is against the second layer of the mirror wafer. The glass wafer is bonded to the mirror wafer such that the first planar surface of the glass wafer extends as a plane over the second cavity and in bonded abutment with the second planar surface. A hermetically closed space that encloses the movable mirror part thus extends between the first planar surface of the glass wafer and a bottom of the first cavity in the cap wafer.

Embodiments of the invention include also a method for manufacturing an optical device from a mirror wafer, a cap wafer, and a glass wafer. The mirror wafer is a layer package that includes a first layer of electrically conductive material, a second layer of electrically conductive material, and a third layer of electrically insulating material between the first layer and the second layer, wherein the first layer has a first side that faces away from the third layer and the second layer has a second side against the third layer; the cap wafer has a third side and a fourth side opposite each other; and the glass wafer has a first planar surface in at least one side of the glass wafer. The method includes fabricating into the cap wafer a first cavity extending from the fourth side into the cap wafer; fabricating through the first layer of the mirror wafer a second cavity that is circumscribed in the first side by a second planar surface; fabricating to the second layer of the mirror wafer a movable mirror part and a suspension spring structure, the mirror part having a reflecting layer in the second side of the second layer; fabricating to the second layer of the mirror wafer an electrical actuation element and wiring for connecting the electrical actuation element to a conductive connection, the electrical actuation element being configured to actuate the movable mirror part in response to electrical signals received through the conductive connection; bonding the cap wafer to the mirror wafer such that the fourth side faces the second layer, and the glass wafer to the mirror wafer such that the first planar surface of the glass wafer extends as a plane over the second cavity and in bonded abutment with the second planar surface, whereby a hermetically closed space that encloses the movable mirror part and extends between the first planar surface of the glass wafer and a bottom of the first cavity in the cap wafer is formed.

Due to the specific orientation of the combined wafers and wafer structures, it is possible to provide a wafer package where high-quality finished surface of a pre-processed glass wafer can be used as the optical window for the scanning mirror. No complex processing stages for creating the spacing for the vertical play of the mirror part in the optical window side are needed, and excellent optical quality for the optical window is very easily achieved.

Further possible advantages of the invention are discussed in more detail with the following embodiments.

BRIEF DESCRIPTION OF THE DRAWINGS

In the following the invention will be described in greater detail, in connection with preferred embodiments, with reference to the attached drawings, in which

FIGS. 9-1 to 9-3 illustrate an embodiment of a method for manufacturing an optical device.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical optical devices that are generally known to a person skilled in the art may not be specifically described herein.

Figure 2:
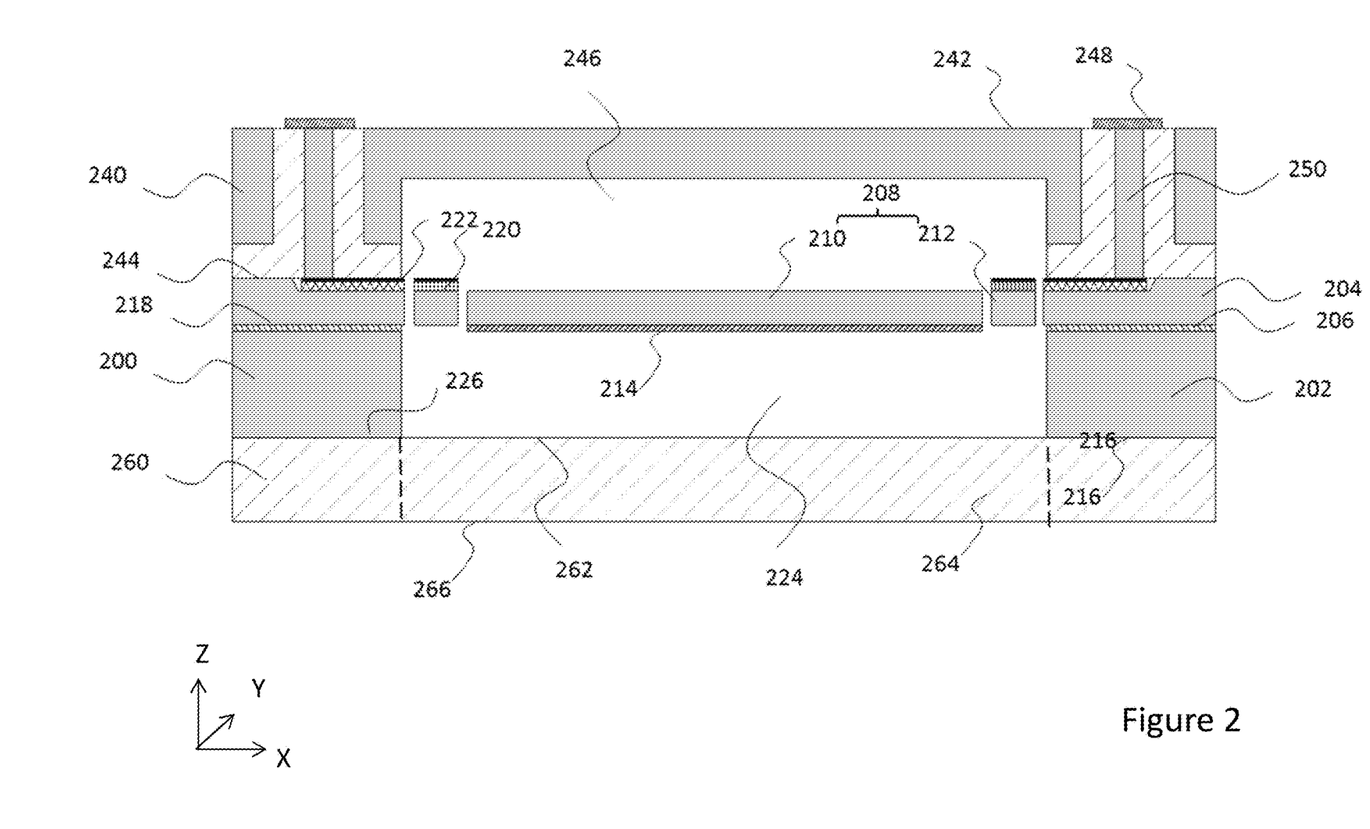
FIG. 2 shows a cross section of an optical device structure.

FIG. 2 shows a cross section of a device structure that illustrates an embodiment of an optical device that includes a bonded package of a mirror wafer 200, a cap wafer 240, and a glass wafer 260.

The mirror wafer 200 comprises a package of a first layer 202 of electrically conductive material, a second layer 204 of electrically conductive material, and a third layer 206 of electrically insulating material between the first layer and the second layer. The mirror wafer may be manufactured from layered solid structures, like silicon-on-insulator (SOI) wafers. A SOI-wafer typically comprises a handle wafer layer, a buried oxide (BOX) layer, and a device wafer layer. The handle wafer layer is usually the thickest part, some hundreds of micron thick, while the device layer wafer is typically tens of microns thick. The BOX layer is typically from fraction of a micron to a few microns thick. The BOX layer may be deposited either on the handle wafer layer, or the device wafer layer, and the two pieces of silicon may be bonded to each other so that the BOX layer is in between them and isolates the device wafer layer electrically from the handle wafer layer. Structures with electromechanical properties are typically manufactured into the device layer of a SOI wafer by etching trenches into and/or through the device layer. Piezoelectric thin films may be deposited and patterned onto the device layer for actuation and sensing of motions of the structures. Sacrificial etching of the BOX layer can be used to mechanically release selected MEMS structures also from the BOX layer.

Accordingly, a mirror element 208 that includes a movable mirror part 210 and a suspension spring structure 212 may be fabricated of the second layer 204 of the mirror wafer. The suspension spring structure 212 may be etched out of the material of the second layer and have a form that provides a required combination of rigidity and elasticity to operate as a spring upon motions of the mirror part. The suspension spring structure 212 may thus couple the mirror part 210 to static parts of the second layer 204 that are bonded to the other layers of the mirror wafer, but allow the mirror part to move in a controlled manner in respect of those static parts. The mirror part 210 may also be etched out of the material of the second layer.

The mirror part 210 may carry a reflecting layer 214. The term carry means herein that the reflecting layer 214 is part of, or is mechanically integrated or fixed to the mirror part, and therefore moves with and along motions of the mirror part. Let us define that in the mirror wafer 200, the first layer 202 has a first side 216 that faces away from the third layer 206, and the second layer 204 has a second side 218 against the third layer 206. The reflecting layer 214 is on a surface of the second layer 204, in the second side 218 of the second layer 204 of the mirror wafer 200. In the exemplary structure of FIG. 2, the mirror part 210 and the suspension spring structure 212 are released also from the third layer 206 by etching.

An electrical actuation element 220 may be coupled to the mirror element 208 and include an electromechanical transducer that transforms electrical energy into mechanical energy (motion) of the mirror part 210. The electrical actuation element may be connected to an electrical energy source, and actuate the mirror part in response to electrical signals received through a conductive connection from the electrical energy source. The electrical actuation element may apply capacitive or electrostatic transduction, or piezoelectric transduction. In the exemplary configuration of FIG. 2, piezoelectric elements that controllably actuate the motions of the mirror are shown. Piezoelectric elements may be formed by depositing and patterning one or more layers of piezoelectric materials on the second layer, to the other side of the second layer, opposite the side of the reflective layer 214 of the mirror part 210.

The electrical actuation element 220 may be coupled to the electrical energy source with wiring 222 that may be fabricated into or onto the structures of the mirror wafer. The wiring 222 may be accessed for electrical connection from some side of the mirror wafer. In the exemplary structure of FIG. 2, the wiring 222 is fabricated on the second layer, in a side that is opposite the second side 218 of the mirror wafer. The wiring 222 is therefore accessible for connection through conductive structures of the overlying cap wafer 240. The conductive connection may, however, be brought to the wiring 222 in other ways. For example, the cap wafer may be smaller than the mirror wafer, and the conductive connection may be brought to the wiring 222 through lateral contacts that run on surfaces of the mirror wafer, which surfaces are not covered by the cap wafer.

Figure 3:
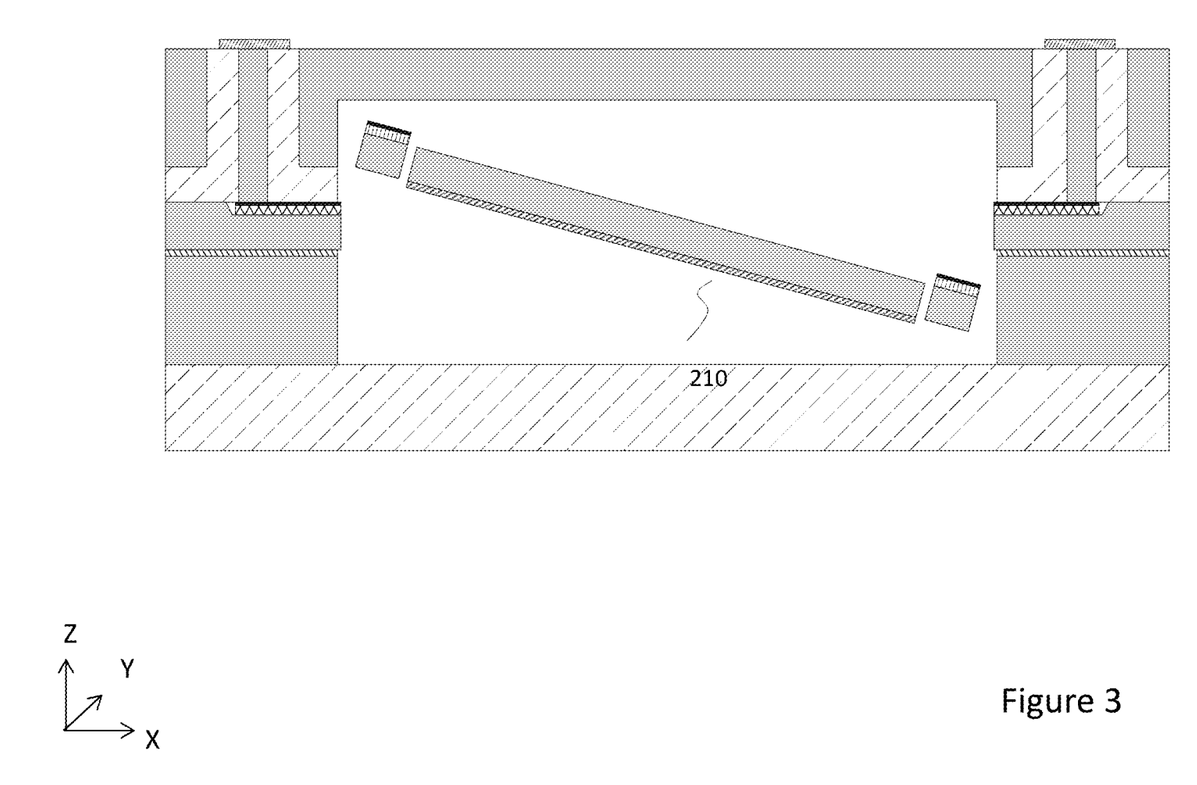
FIG. 3 shows the structure of FIG. 2 in a tilted state.

The cap wafer 240 may be bonded to the mirror wafer 200. Let us define that the cap wafer 240 and has a third side 242 that faces away from mirror wafer 200, and a fourth side 244 that becomes bonded against the second layer 204 of the mirror wafer 200. Let us also define that planar sides of wafers are considered along horizontal directions, denoted with X and Y in FIG. 2, and a direction orthogonal to them is a vertical direction, denoted with Z in FIG. 2. The cap wafer 240 may include a first cavity 246 that extends from the fourth side 244 of the cap wafer into the cap wafer. The first cavity 246 may be dimensioned to form into the cap wafer a space that enables displacements of the mirror element in a vertical direction during its scanning motion. FIG. 3 shows the structure of FIG. 2 in a state where the mirror part 210 is in a tilted position during a scanning cycle.

The cap wafer 240 may also include an electrical contact element 248 accessible from the third side 242 of the cap wafer, and a conductive lead 250 extending through the cap wafer. The conductive lead 250 may be a conductive via, formed of a silicon material of the cap wafer, and insulated with surrounding glass filling. However, other types of conductive leads may be applied within the scope. The conductive lead 250 may begin from the electrical contact element 248 in the third side, and be accessible for the wiring 222 of the mirror wafer from the fourth side 244 of the cap wafer. The conductive lead 250 is positioned in relationship with the wiring 222 of the mirror wafer such that when the cap wafer and the mirror wafer are bonded together, the electrical actuation element 220 becomes electrically connected to the conductive lead 250 of the cap wafer. Due to this, the electrical actuation element 220 is able to actuate the movable mirror part 210 in response to electrical signals received through the electrical contact element 248 in the externally accessible third side 242 of the cap wafer 240.

In the exemplary embodiment of FIG. 2, the suspension spring structure 212 may include structured silicon beam springs, where one end of each spring is coupled to the rigid, bonded part of the mirror wafer, and the other end of each spring is coupled to the mirror part 210. The suspension spring structure may include curved form beams applied in the referred prior art document of FIG. 1. Alternatively, springs of a suspension spring structure may be formed of a combination of one or more linear or curved beams coupled together to enable the desired scanning motion. A variety of spring forms may be applied within the scope, as long as a controlled elastic suspension between the rigid parts of the mirror wafer and the mirror part is enabled.

The mirror wafer 200, may include a second cavity 224 that extends through the first layer 202 of the mirror wafer. The reflective layer 214 may thus be formed of a metal reflector layer or stack, deposited into the bottom of the second cavity, on the mirror part 210 that is exposed and thus accessible through the second cavity 224. The reflective layer 214 may be formed on the mirror part 210 after the third layer 206 is removed to release the moving and suspending parts in the second layer, but before the glass wafer 260 and the mirror wafer 200 are bonded together, as shown in the exemplary embodiment of FIG. 2. The reflective layer 214 may alternatively be formed on the third layer 206, but anyway before the glass wafer 260 and the mirror wafer 200 are bonded together, as shown in the exemplary embodiment of FIG. 2.

The glass wafer 260 may be bonded against the first layer 202 of the mirror wafer 200. For example, alkaline containing glasses can be bonded to silicon easily by anodic bonding. For all types of glasses (alkaline or non-alkaline), well known glass-frit or metal bonding techniques are available. The glass wafer 260 may be a planar element, which means that it may have a first planar surface 262 in at least one side of the glass wafer. A variety of glass materials are transparent in a wide wavelength area, and enable provision of finished high optical quality planar surfaces.

The second cavity 224 may be circumscribed, or in other words surrounded, in the first side 214 of the first layer by a second planar surface 226. The glass wafer 260 may be bonded with the mirror wafer 200 such that the first planar surface 262 of the glass wafer 260 is set against the second planar surface 226 of the first layer 202 of the mirror wafer 200. The first planar surface 262 of the glass wafer thereby extends as a plane over the second cavity 224 and continues extending along the same plane in bonded abutment with the second planar surface 226 of the mirror wafer 200. As a result, a hermetically closed space that encloses the movable mirror part 210, and extends vertically between the first planar surface 262 of the glass wafer and a bottom of the first cavity 246 in the cap wafer is formed.

In the described configuration, the first planar surface 262 forms the inner surface of the optical window, and thus partially defines the quality of the optical window 264 for the operation of the scanning mirror part 210. Due to the specific orientation of the combined wafers and wafer structures, the inner surface of the optical window may be formed of the high-quality finished surface of a pre-processed glass wafer. No complex processing stages for creating the spacing for the vertical play of the mirror part in the optical window side are needed, and excellent optical quality for the optical window is very easily achieved.

Advantageously, also the other side of the glass wafer 260, i.e. the outer side 266 of the glass wafer is a finished planar surface with high optical quality, or at least includes such planar surface in parts that form the optical window 264 for the mirror element 208. Thin-film anti-reflective optical coatings can be further deposited to the outer side of the glass wafer to further minimize optical losses in the optical window 264. Thin-film anti-reflective coatings can be also deposited to the inner side 262 of the glass wafer before bonding. In such case the coating needs to be removed from the bonding interface 226 before bonding using lithography and etching techniques generally known to a person skilled in the art.

Figure 4:
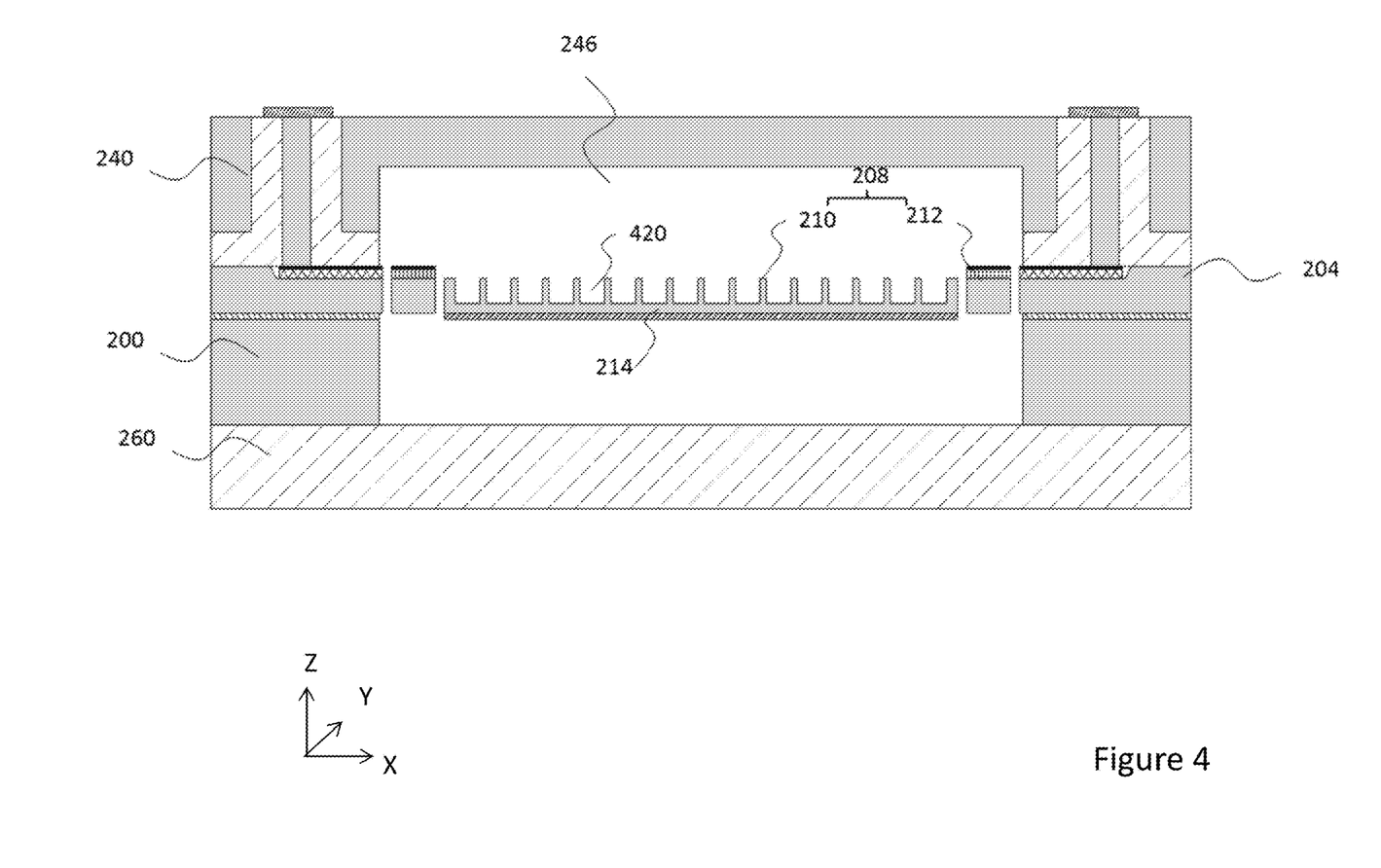
FIG. 4 illustrates a further embodiment of an optical device structure.

FIG. 4 illustrates a further embodiment of the structure shown in FIGS. 2 and 3. In the embodiment of FIG. 4, a backside of the mirror part 210 includes a plurality of indentations 420. The backside of the mirror part is herein the side of the second layer 204 of the mirror wafer opposite the reflective layer. The backside of the mirror part is thus opposite the second side 218 of the second layer, and faces the first cavity 246 of the cap wafer 240. The one or more indentations 420 may be etched, for example as recess etching, into the second layer 204 before the mirror wafer 200 and the cap wafer 240 are bonded together. Other forms of indentations may be applied, as well. When a relatively large area mirror is made of relatively thin silicon layers, the inertial forces tend to bend the mirror part. For this, a mirror part is conventionally quite thick, or a thinner mirror part is reinforced with additional thick structures. In the structure shown in FIG. 4, the indentations reduce the inertial mass of the mirror part, and the regions of the second layer embracing the indentations 420 reinforce the structure. Sensitivity of the mirror part 210 for bending due to inertial forces is thus improved.

Figure 5:
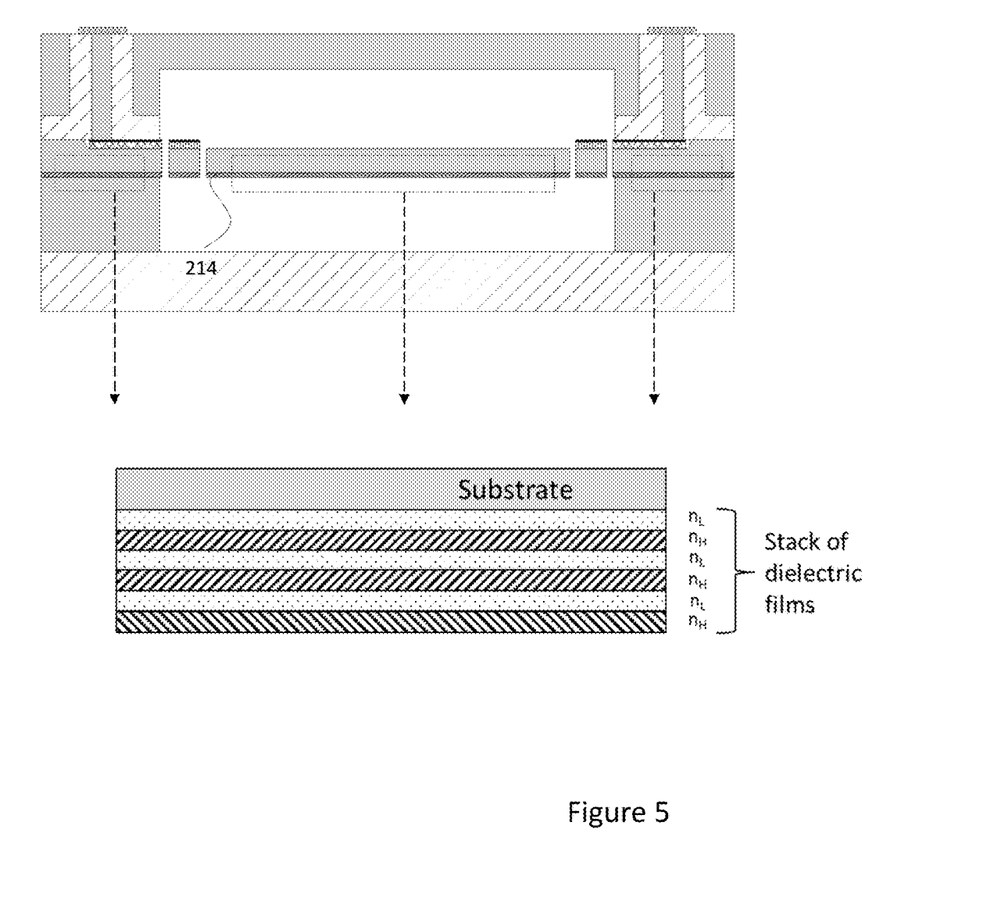
FIG. 5 illustrates an alternative implementation for the reflecting layer.

Fabrication of the reflective surface on the mirror part 210 in FIGS. 2, 3 and 4 requires deposition and patterning of reflective metallic or dielectric thin film stacks into a bottom of a relatively deep second cavity. Depths applied in practice may be of the order of 650 micrometers, which require using special patterning techniques developed for MEMS manufacturing. Such techniques include spray coating and inkjetting of photoresists. They are commercially available but not widely used yet. FIG. 5 illustrates a further embodiment where such special processes are not needed, because the reflecting layer is included into the third layer of the mirror wafer at the time of manufacturing the mirror wafer. For example, as shown in FIG. 5, the reflective layer 214 may be formed of a stack of dielectric films that are deposited on the first layer wafer or on the second layer wafer of the mirror wafer before their bonding process, or as part of their bonding process.

The reflective layer 214 may include a stack of dielectric films that have different values of the refractive index n: Low n ($n_L$) and High n ($n_H$). By selecting the thicknesses and the number films in stack judiciously, the transmitted light rays can be arranged to cancel each other due to correctly selected phase shifts, whereby the stacks acts as a mirror. This technique is widely used to create reflective surfaces for various purposes, for example high quality laser mirrors. Mathematical details of the stack design are described in optics textbooks and thus well known to a person skilled in the art. For conciseness, they will not be elaborated here in more detail.

High n materials of the reflective stack may include, for example, Ta2O5 (Tantalum pentoxide), TiO2 (Titanium dioxide), Nb2O5 (Niobium pentoxide), and LaTiO3 (Lanthanum Titanate). Low n materials of the reflective stack may include, for example silicon dioxide (SiO2). Also amorphous silicon is sometimes used as a High n material.

As mentioned, the reflective layer may be formed during fusion bonding process of a handle wafer and a device layer wafer of a SOI wafer. Since the annealing temperature used in the fusion bonding can be as high as 1100-1200° C., it is advantageous to select the dielectric materials so that their melting temperatures are above this temperature. Melting points of some commonly used materials are 1,872° C. for Ta2O5, 1,843° C. for TiO2, 1,512° C. for Nb2O5 and >2000° C. LaTiO3, and 1,713° C. SiO2.

Let us assume that in the exemplary embodiment of FIG. 5, the Low n material is SiO2 and the High n material is Ta2O5. For the sake simplicity, a structure with three High n/Low n pairs is shown. A possible way to design the dielectric stack is to select film thicknesses so that the geometrical thickness d of each film in the stack has the value $\lambda/4n$ where $\lambda$ is the wavelength of the light and n is the refractive index of the film. The number film layers may be increased until the desired value of reflectivity is reached, for example 5-10 High n/Low n pairs. There are both commercial and free software packages available to design dielectric mirrors with desired reflectivity and bandwidth.

Figure 6:
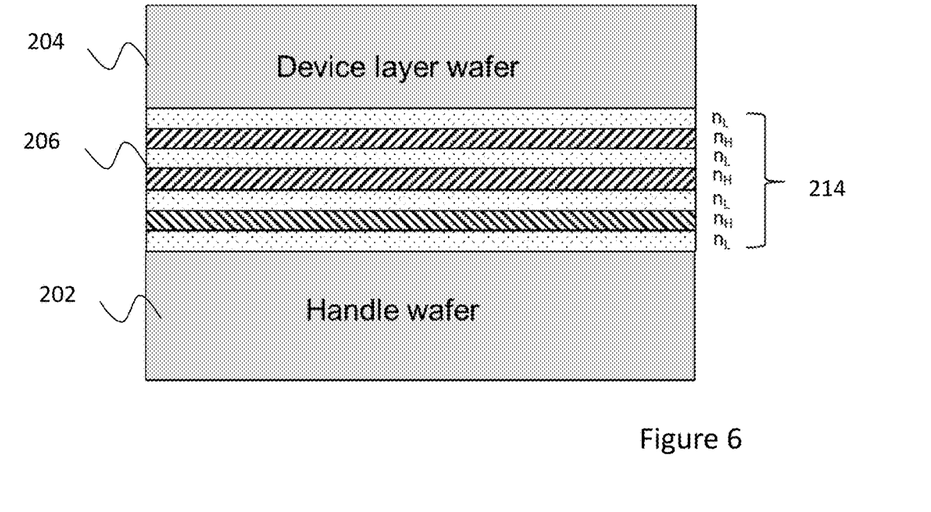
FIG. 6 illustrates an example of use of the dielectric stack.
Figure 7:
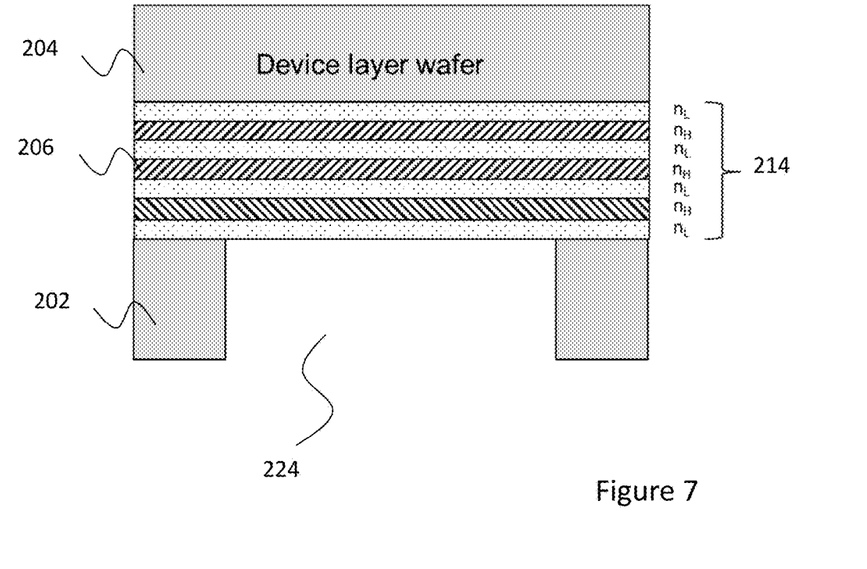
FIG. 7 illustrates another example of use of the dielectric stack.

FIGS. 6 and 7 illustrate an example of use of the dielectric stack of FIG. 5 in the configurations of FIGS. 2 and 3. FIG. 6 shows the described mirror wafer 200 with the first layer (handle wafer of a SOI wafer) 202, the second layer (the device layer wafer of the SOI wafer) 204 and the third layer 206, now formed of the layer of dielectric films between the first layer and the second layer wafers 202, 204. The dielectric stack forms the reflective layer 214 that may now be exposed by etching the second cavity 224 through the first layer, as shown in FIG. 7. The third layer 206 may thus remain on the mirror part, only parts of it need to be etched to release the moving and elastic parts of the mirror element from the second layer 204 and the third layer 206. The non-etched part of the third layer will form the reflective layer 214 that is carried on the mirror part of the second layer 204.

Figure 8:
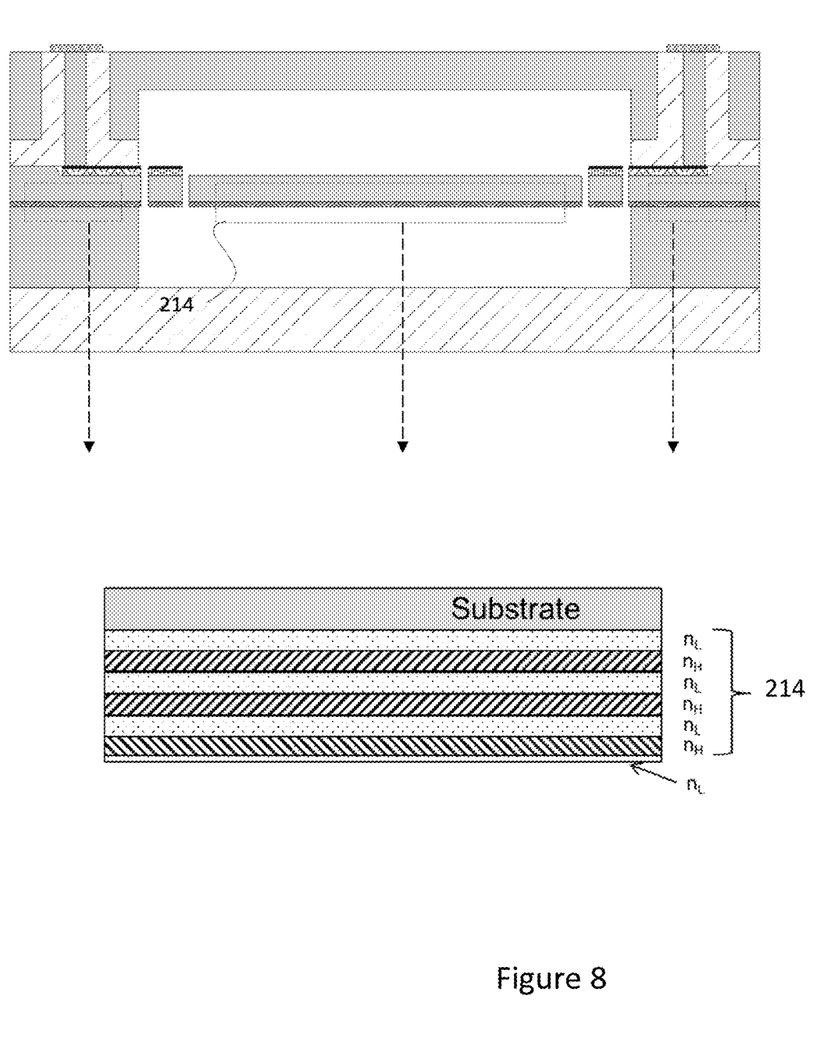
FIG. 8 illustrates a further example of use of the dielectric stack.

In a reflective dielectric stack, the High n material Ta2O5 would be arranged to the top layer, i.e. to the direction of the incoming laser light. However, it has been observed empirically that TaO5 film reflectivity tends to degrade due to oxygen depletion under the vacuum. As shown in FIG. 8, a very thin (1 nm) passivation layer of SiO2 may be arranged to the top layer of the reflective layer to maintain the quality of the Ta2O5 film mirror coating.

Figure 91:
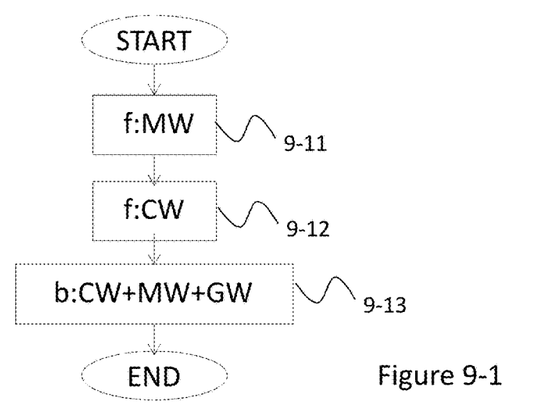
Figure 92:
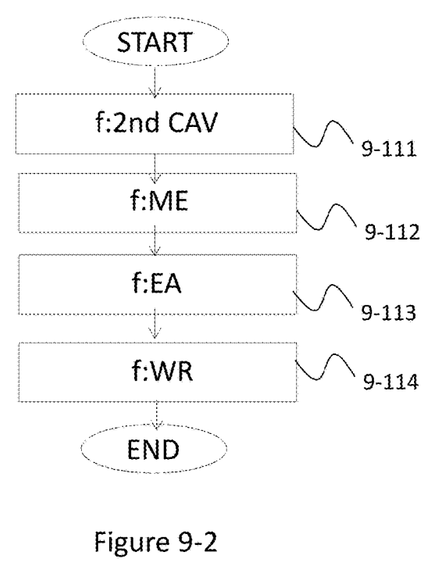
Figure 93:
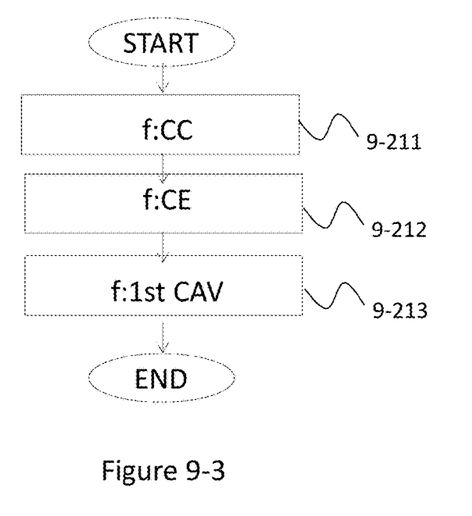

FIGS. 9-1 to 9-3 illustrate an embodiment of a method for manufacturing an optical device. FIG. 9-1 illustrates the main steps of the method. The two first steps 9-11 and 9-12 are basically independent of each other so their order may be changed, or they may be performed in parallel. Further details for the description of the method steps may be referred from description of FIGS. 2 to 8. In the method, structures of a mirror wafer MW are manufactured (step 9-11). The mirror wafer MW may be a layer package that includes a first layer of electrically conductive material, a second layer of electrically conductive material, and a third layer of electrically insulating material between the first layer and the second layer. The first layer may have a first side that faces away from the third layer and the second layer may have a second side against the third layer. A ready-made SOI wafer may be applied in the step, or a wafer package including a dielectric stack disclosed with FIGS. 5 to 8 may be manufactured for the purpose.

Main steps of the step 9-11 are described in more detail with FIG. 9-2. It is noted that also here the method steps illustrate stages of the method in a generic order, which may vary, depending on the applied manufacturing processes. A second cavity $2^{nd}$ CAV may be fabricated by etching through the first layer of the mirror wafer (step 9-111). The second cavity may be etched to a planar surface of a wafer so that it is circumscribed a planar surface, earlier referred to as the second planar surface. A mirror element ME including a movable mirror part and a suspension spring structure may be fabricated (step 9-112) to the second layer of the mirror wafer. The mirror part may be arranged to have a reflecting layer in the second side of the second layer. The third layer may be removed by etching via the second cavity, and the reflecting layer deposited on the second layer through the second cavity. Alternatively, the reflecting layer may be deposited on the third layer. Alternatively, the third layer may be, or include the reflecting layer that becomes exposed in fabrication of the second cavity.

To the second layer of the mirror wafer may be fabricated (step 9-113) an electrical actuation element EA. Also wiring WR for connecting the electrical actuation element to an external actuation energy source may be fabricated (step 9-114) to the second layer of the mirror wafer. The electrical actuation element may be configured to actuate the movable mirror part in response to electrical signals received from the external actuation energy source.

In the main method, structures of a cap wafer CW are also manufactured (step 9-12). The cap wafer has a third side and a fourth side opposite each other. Main steps of the step 9-12 are described in more detail with FIG. 9-3. The method steps illustrate stages of the method in a generic order, which may vary, depending on the applied manufacturing processes. A conductive lead CC that extends through the cap wafer may be fabricated (step 9-211) to the cap wafer. The conductive lead may be formed, for example, by removing material by etching around a longitudinal via structure to a depth, and filling the surrounding space with glass material. The via structure may then be exposed by thinning the cap wafer from the opposite side. As discussed, alternative methods not requiring through layer leads may be applied within the scope. An electrical contact element CE accessible from the third side may also be fabricated (step 9-212) into the cap wafer. The electrical contact element may be, for example, deposited by patterning a structure of conductive material onto a surface in the third side of the cap wafer. Further, a first cavity $1^{st}$ CAV extending from the fourth side into the cap wafer may be fabricated by etching into the cap wafer (step 9-213).

The glass wafer has a first planar surface in at least one side of the glass wafer. In the main method, the cap wafer, the mirror wafer and a glass wafer may bonded (step 9-13). The cap wafer may be bonded to the mirror wafer such that the fourth side faces the second layer, and the glass wafer to the mirror wafer such that the first planar surface of the glass wafer extends as a plane over the second cavity and is in bonded abutment with the second planar surface. The wafers may be bonded in separate bonding process stages or in one bonding process stage. A hermetically closed space that encloses the movable mirror part and extends between the first planar surface of the glass wafer and a bottom of the first cavity in the cap wafer is thereby formed.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. An optical device that includes a movable mirror part, comprising:
   a glass wafer with a first planar surface in at least one side of the glass wafer;
   a mirror wafer that comprises a package of a first layer of electrically conductive material, a second layer of electrically conductive material, and a third layer of electrically insulating material between the first layer and the second layer, wherein the first layer has a first side that faces away from the third layer, and the second layer has a first side against the third layer;
   a suspension spring structure for suspending the movable mirror part, wherein the movable mirror part and the suspension spring structure are part of the second layer of the mirror wafer;
   a cap wafer that has a first side and a second side, and includes a first cavity that extends from the second side of the cap wafer into the cap wafer; wherein
   a second cavity that extends through at least the first layer of the mirror wafer, wherein the second cavity is circumscribed on the first side of the first layer by a second planar surface;
   a reflecting layer carried by the mirror part at a bottom of the second cavity;
   wherein
   the cap wafer is bonded to the mirror wafer such that the first side of the cap wafer faces away from mirror wafer, and the second side of the cap wafer is against the second layer of the mirror wafer;
   the glass wafer is bonded to the mirror wafer such that the first planar surface of the glass wafer extends as a plane over the second cavity and in bonded abutment with the second planar surface;
   a hermetically closed space that encloses the movable mirror part extends between the first planar surface of the glass wafer and a bottom of the first cavity in the cap wafer;
   an electrical actuation element is configured to actuate the movable mirror part in response to electrical signals received through a conductive connection;
   the conductive connection includes an electrical contact element accessible from the first side of the cap wafer, and a conductive via formed of a silicon material of the cap wafer, insulated with a surrounding filling and extending from the electrical contact element through the cap wafer; and
   the electrical actuation element is electrically connected to the conductive via.

2. A device according to claim 1, wherein the reflecting layer is in the first side of the second layer of the mirror wafer.

3. A device according to claim 1, wherein the surrounding filling is a glass filling.

4. A device according to claim 1, wherein the mirror wafer is formed of a silicon-on-insulator wafer.

5. A device according to claim 1, wherein
   the glass wafer has planar surfaces in both sides of the glass wafer, an inner surface in one side and an outer surface in the other side of the glass wafer, wherein the inner surface is the first planar surface;
   the outer surface extends as a plane at least over the second cavity.

6. A device according to claim 5, further comprising an anti-reflective optical coating on the outer surface of the glass wafer.

7. A device according to claim 1, wherein
a frontside of the mirror part is in the first side of the second layer of the mirror wafer, and a backside of the mirror part is in a second side of the second layer;
the backside of the mirror part includes a plurality of indentations.

8. A device according to claim 1, wherein the reflective layer includes a metal reflector stack, deposited into the bottom of the second cavity.

9. A device according to claim 1, wherein
the reflective layer includes a stack of dielectric films, exposed to light by the second cavity;
the dielectric films have different values of refractive indexes, configured such that the stack of dielectric films reflect light as a mirror.

10. A device according to claim 9, wherein
a top of the stack of dielectric films is oriented towards incoming light beams; and
a top layer of the stack of dielectric films includes a film of dielectric material with high refractive index.

11. A device according to claim 10, wherein the top layer of the stack is covered by a protective film of silicon dioxide.

12. A method for manufacturing an optical device from a mirror wafer, a cap wafer, and a glass wafer, wherein
the mirror wafer is a layer package that includes a first layer of electrically conductive material, a second layer of electrically conductive material, and a third layer of electrically insulating material between the first layer and the second layer, wherein the first layer has a first side that faces away from the third layer and the second layer has a first side against the third layer;
the cap wafer has a first side and a second side opposite each other;
the glass wafer has a first planar surface in at least one side of the glass wafer; and the method includes:
fabricating into the cap wafer a first cavity extending from the second side of the cap wafer into the cap wafer;
fabricating into the cap wafer a conductive connection that includes an electrical contact element accessible from the first side of the cap wafer, and a conductive via formed of a silicon material of the cap wafer, insulated with a surrounding glass filling and extending from the electrical contact element through the cap wafer;
fabricating through the first layer of the mirror wafer a second cavity that is circumscribed on the first side of the first layer by a second planar surface;
fabricating to the second layer of the mirror wafer a movable mirror part and a suspension spring structure, the mirror part having a reflecting layer in the first side of the second layer;
fabricating to the second layer of the mirror wafer an electrical actuation element and wiring for connecting the electrical actuation element to a conductive connection, the electrical actuation element being configured to actuate the movable mirror part in response to electrical signals received through the conductive connection;
bonding the cap wafer to the mirror wafer such that the second side of the cap wafer faces the second layer, and the glass wafer to the mirror wafer such that the first planar surface of the glass wafer extends as a plane over the second cavity and in bonded abutment with the second planar surface, whereby the electrical actuation element is electrically connected to the conductive via and a hermetically closed space that encloses the movable mirror part and extends between the first planar surface of the glass wafer and a bottom of the first cavity in the cap wafer is formed.

13. A method for manufacturing an optical device according to claim 12, further comprising
fabricating for the conductive connection into the cap wafer an electrical contact element accessible from the second side of the cap wafer, and a conductive lead that extends through the cap wafer; and
fabricating on the second layer wiring for connecting the actuation element to the conductive lead.

14. A method for manufacturing an optical device according to claim 12, further comprising fabricating structures of the mirror wafer of a silicon-on-insulator wafer.

15. A method for manufacturing an optical device according to claim 14, further comprising fabricating the third layer of the mirror wafer to include a stack of dielectric films with different values of refractive index and configured such that the stack of dielectric films reflect light as a mirror.

* * * * *